United States Patent
Conner et al.

(10) Patent No.: US 7,298,622 B2
(45) Date of Patent: Nov. 20, 2007

(54) MODULAR HEAT SINK ASSEMBLY

(75) Inventors: Troy Everette Conner, York, PA (US); Justin Shane McClellan, Camp Hill, PA (US); Matthew Richard McAlonis, Elizabethtown, PA (US); Attalee S. Taylor, Palmyra, PA (US)

(73) Assignee: Tyco Electronics Corporation, Middletown, PA (US)

( * ) Notice: Subject to any disclaimer, the term of this patent is extended or adjusted under 35 U.S.C. 154(b) by 162 days.

(21) Appl. No.: 11/153,028

(22) Filed: Jun. 15, 2005

(65) Prior Publication Data

US 2006/0285297 A1 Dec. 21, 2006

(51) Int. Cl.
*H05K 7/20* (2006.01)

(52) U.S. Cl. .................................... 361/710
(58) Field of Classification Search ............. 361/710, 361/704, 719, 760
See application file for complete search history.

(56) References Cited

U.S. PATENT DOCUMENTS

| | | | |
|---|---|---|---|
| 3,370,203 A * | 2/1968 | Kravitz et al. ............. 361/730 |
| 4,748,495 A * | 5/1988 | Kucharek ................... 257/713 |
| 5,166,775 A * | 11/1992 | Bartilson ................... 361/690 |
| 5,734,555 A | 3/1998 | McMahon | |
| 5,917,703 A * | 6/1999 | Murphy ..................... 361/704 |
| 6,252,774 B1 * | 6/2001 | Rife .......................... 361/704 |
| 6,381,836 B1 * | 5/2002 | Lauruhn et al. ............. 29/831 |
| 6,680,848 B2 * | 1/2004 | Petit et al. ................. 361/704 |
| 6,746,261 B2 * | 6/2004 | Petit et al. ................. 439/331 |
| 2004/0203528 A1 * | 10/2004 | Ammar et al. ............ 455/90.3 |

* cited by examiner

*Primary Examiner*—J. F. Duverne

(57) ABSTRACT

A heat sink assembly includes a circuit board, a first integrated circuit package and a second integrated circuit package mounted to the circuit board in a stacked relation to one another. A first heat sink is engaged to and is in thermal communication with the first integrated circuit package, and a second heat sink is engaged to and is in thermal communication with the second integrated circuit package, wherein each of the first and second heat sinks are positioned over the first and second integrated circuit packages on a single side of the circuit board. Optionally, the first heat sink may include an opening extending therethrough and exposing the second integrated circuit package. The second heat sink may extend through the opening and engage the second integrated circuit package.

20 Claims, 4 Drawing Sheets

MODULAR HEAT SINK ASSEMBLY

BACKGROUND OF THE INVENTION

This invention relates generally to a modular heat sink assembly, and more particularly, to a heat sink assembly for cooling electronic components oriented in a stacked configuration.

Modern electronic devices typically include numerous components or packages therein. However, there is an increasing demand to reduce the size of the components within the electronic devices in order to reduce the overall size of the device itself or to provide more components within the device. As such, the size and weight requirements for components within electronic devices are constantly decreasing. However, in today's devices, there is a continuously increasing demand for signal and power output by components within the devices. As such, the components function at a higher output, thus producing more heat.

It is well known to use a heat sink to cool a heat generating integrated circuit (IC) component or package. Typically, a heat sink is arranged in close contact with heat generating components of the package. Heat generated by the component is transferred to the heat sink and then dissipated from the heat sink to the surrounding air.

At least some known heat sink arrangements include multiple heat sinks oriented on opposite sides of stacked components. For instance, one heat sink is employed to cool a first heat generating component from above, and another heat sink is employed to cool a second heat generating component from below when the first and second components are stacked upon one another, or when the first and second components are mounted on opposing sides of a common circuit board. Such arrangements are commonly found, for example, in electronic assemblies including a processor and a voltage regulator module which are mounted to a circuit board. Because the voltage regulator module overlies and generally conceals the processor in use, one heat sink assembly is provided to cool the voltage regulator module on one side of the board and another heat sink is provided to cool the processor from the opposite side of the board. Multiple heat sinks in different locations in relation to stacked components, however, can be problematic.

For example, assembly of the heat sinks to the stacked components can be difficult, especially as the size of the IC packages or components decreases. Also, the heat sinks sandwiching stacked IC components can interfere with clearance requirements when multiple circuit boards or components are employed in close relation to one another. It would be desirable to provide a more compact and lower cost heat sink assembly for stacked IC components.

BRIEF DESCRIPTION OF THE INVENTION

According to an exemplary embodiment, a heat sink assembly includes a circuit board, a first integrated circuit package and a second integrated circuit package mounted to the circuit board in a stacked relation to one another. A first heat sink is engaged to and is in thermal communication with the first integrated circuit package, and a second heat sink is engaged to and is in thermal communication with the second integrated circuit package, wherein each of the first and second heat sinks are positioned over the first and second integrated circuit packages on a single side of the circuit board.

Optionally, the first integrated circuit package may be a central processing unit, and the second integrated circuit package may be a voltage regulator module. At least one power connector may be positioned between the first and second integrated circuit packages such that the first integrated circuit package, the at least one power connector, and the second integrated circuit package are vertically stacked over the same side of the circuit board.

According to another exemplary embodiment, a heat sink assembly includes a first heat sink having a thermal interface configured to be in thermal communication with a first integrated circuit package. A second heat sink is surrounded by the first heat sink and includes a thermal interface configured to be in thermal communication with a second integrated circuit package, wherein the first and second integrated circuit packages are vertically stacked with respect to one another.

According to yet another embodiment, a heat sink assembly includes a circuit board, a central processing unit mounted to the circuit board, and a voltage regulator module mounted to the central processing unit, wherein the central processing unit and the voltage regulator are mounted in a stacked relation to one another on a common side of the circuit board. A first heat sink is engaged to and is in thermal communication with the central processing unit, and a second heat sink is surrounded by the first heat sink. The second heat sink is engaged to and is in thermal communication with the voltage regulator module.

DETAILED DESCRIPTION OF THE INVENTION

Figure 1:
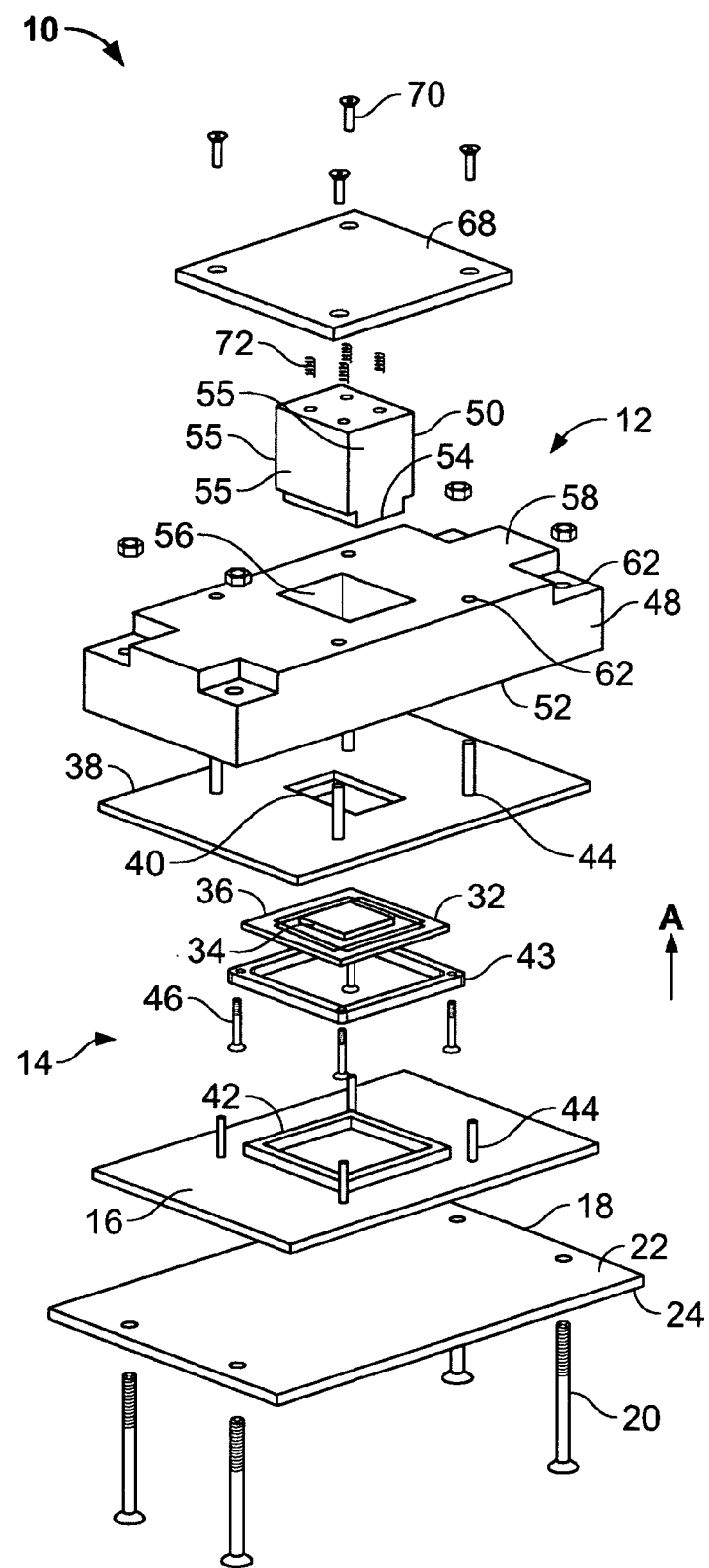
FIG. 1 illustrates an exploded top perspective view of an electronic assembly formed in accordance with an exemplary embodiment of the present invention.
Figure 2:
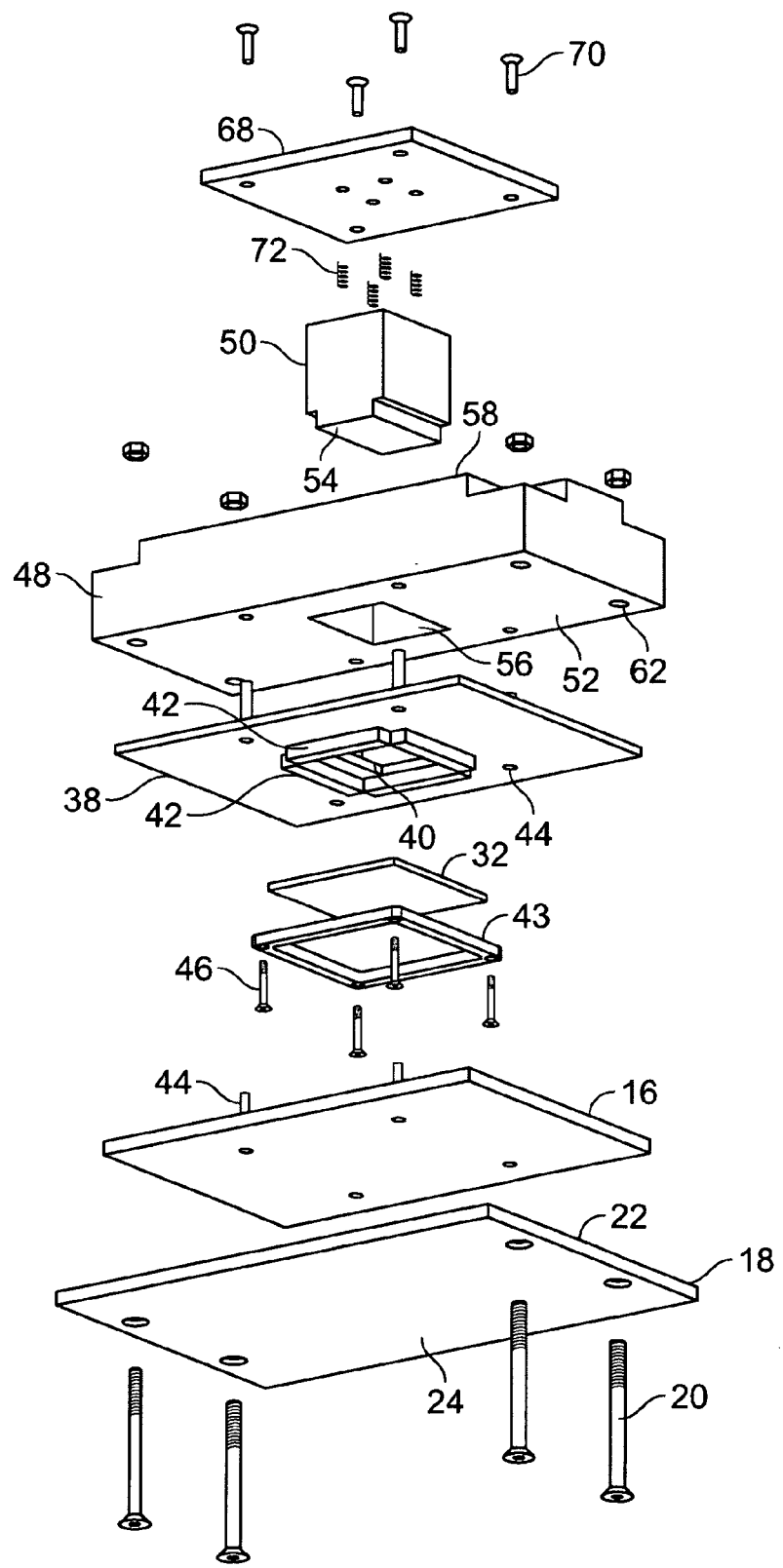
FIG. 2 illustrates an exploded bottom perspective view of the electronic assembly shown in FIG. 1.

FIGS. 1 and 2 illustrates top and bottom perspective views, respectively, of an electronic assembly 10 formed in accordance with an exemplary embodiment of the present invention. The assembly 10 includes a compact heat sink assembly 12 capable of cooling stacked integrated circuit (IC) components or packages 14. The IC components 14 may be loaded onto a socket or connector 16 that is mounted on a circuit board 18. The assembly 10 is coupled together using a plurality of fasteners 20.

In an exemplary embodiment, the assembly 10 may effectively cool power consuming devices such as, central processing units, application specific integrated circuits (ASIC), or the like, together with peripheral and/or auxiliary devices such as, voltage regulator modules, monitoring devices, and the like. In particular, the IC components may be cooled from only one, as opposed to both, sides of the board 18, and may be rather easily assembled in the manner explained below. While the invention will be described in terms of specific IC components, it is to be understood that the following description is for illustrative purposes only and is but one potential application of the inventive concepts herein.

As illustrated in FIGS. 1 and 2, the circuit board 18 has a first or upper side 22 and a second or lower side 24 opposite the upper side 22. The connector 16 and the IC components 14 are mounted to the first or upper side 22 of the circuit board 18. In one embodiment, the connector 16 is a land grid array (LGA) connector. However, in alternative embodiments, other commonly used connector formats such as a pin grid array (PGA) or ball grid array (BGA) may be employed. The IC components 14 are positioned and aligned with respect to the connector 16.

In an exemplary embodiment, an IC component 14, such as, a central processing unit (CPU) 32 engages the connector 16. In one embodiment, the CPU 32 includes an integrated heat sink 34 extending from an outer surface 36 of the CPU 32. The integrated heat sink 34 is in thermal communication with the CPU 32 for dissipating heat from the CPU 32.

In an exemplary embodiment, another IC component 14 such as, a voltage regulator (VR) module 38 is mounted to and generally overlies the CPU 32 in a stacked relation on the circuit board 18. In a further embodiment, another IC component 14 such as, by way of example only, another CPU may be mounted to the circuit board 18. In one embodiment, the VR module 38 includes an opening 40 extending therethrough. The opening 40 provides access from above to the CPU 32 positioned below the VR module 38. The opening 40 may be positioned such that a portion of the CPU 32 is exposed through the opening 40. Specifically, the integrated heat sink 34 is exposed through the opening 40 when the VR module 38 is assembled. Alternatively, the electronic assembly 10 may include two VR modules 38 positioned proximate one another such that a gap (not shown) is defined therebetween to expose a portion of the CPU 32 between the VR modules.

Multiple connectors 42, such as, for example, power connectors, may be mounted between the CPU 32 and the VR module 38. In one embodiment, each connector 42 is soldered to the VR module 38 prior to mounting the VR module 38 onto the CPU 32. In another embodiment, each connector 42 is secured using a frame or clip 43. Additionally, power connectors 42 may be mounted between the CPU 32 and the connector 16.

Each of the CPU 32, the VR module 38, and the connectors 42 are substantially aligned with one another such that the components have a vertically stacked arrangement. Moreover, each of the CPU 32, the VR module 38, and the connectors 42 are arranged on the same side of the circuit board 18 such that each of the components are substantially aligned in the direction of arrow A. Furthermore, each of the CPU 32, the VR module 38, and the connectors 42 may include fastening bores 44 extending therethrough and/or therefrom such that a fastener 46, such as, for example, a screw or pin, may couple the components to one another.

In an exemplary embodiment, the heat sink assembly 12 includes a first, or outer, heat sink 48 and a second, or inner, heat sink 50. In alternative embodiments, more heat sinks may be provided. The outer heat sink 48 has a lower surface 52 that receives heat generated from an upper surface of the VR module 38. Specifically, when assembled, the lower surface 52 is in abutting contact and in thermal communication with the VR module 38. Moreover, the inner heat sink 50 has a lower surface 54 that receives heat generated from the CPU 32, or more specifically, the heat sink 34 of the CPU 32 that is exposed through the VR module 38. The inner heat sink 50 may also receive heat generated from the VR module 38. When assembled, the lower surface 54 is in abutting contact and in thermal communication with the CPU heat sink 34. Additionally, when assembled, outer surfaces 55 of the inner heat sink 50 are in abutting contact and in thermal communication with the outer heat sink 48.

In an exemplary embodiment, each heat sink 48 or 50 may include a base and a plurality of fins for dissipating the heat from the corresponding IC component 14. The heat sink base and the fins are typically fabricated from metal such as aluminum or copper, and further, may be fabricated from the same or different metals. For instance, in one embodiment the heat sink base may be fabricated from copper while the fins may be fabricated from aluminum. In another embodiment, each heat sink 48 or 50 may include a solid metallic body for dissipating the heat from the corresponding IC component 14.

The outer heat sink 48 includes an opening, or bore, 56 extending therethrough. The opening 56 extends between an upper surface 58 and the lower surface 52 of the outer heat sink 48. The opening 56 may be positioned such that the CPU 32 is accessible through the opening 56 and through the VR module opening 40 when the outer heat sink 48 is installed. The integrated heat sink 34 is exposed through the opening 56 and the VR module opening 40. The VR module 38 may also be partially exposed through the opening 56. The outer heat sink 48 includes a plurality of fastening bores 62 extending from the upper surface 58 to the lower surface 52. In another embodiment, the fastening bores 62 extend from one of the upper surface 58 or the lower surface 52.

The inner heat sink 50 is sized and shaped to fit within the opening 56 defined in the outer heat sink 48 such that the inner heat sink 50 is surrounded by, or encapsulated by, the outer heat sink 48 when the inner heat sink 50 is received in the outer heat sink opening 56. In one embodiment, inner heat sink 50 substantially fills the opening 56 and includes a lower portion 64 sized and shaped to fit within the opening 40 defined in the VR module 38 and to engage the heat sink 34 of the CPU 32.

The heat sink assembly 12 also includes a load plate 68. The load plate 68 is coupled to the outer heat sink 48 using a plurality of fasteners 70 and extends over the opening 56 defined in the outer heat sink 48 and also the inner heat sink 50 located therein. Moreover, a plurality of biasing members 72, such as, but not limited to, compression springs may be positioned between the load plate 68 and the inner heat sink 50. The biasing members 72 produce a normal force against the inner heat sink 50 to ensure engagement of the inner heat sink 50 with the heat sink 34 of the CPU 32.

Figure 3:
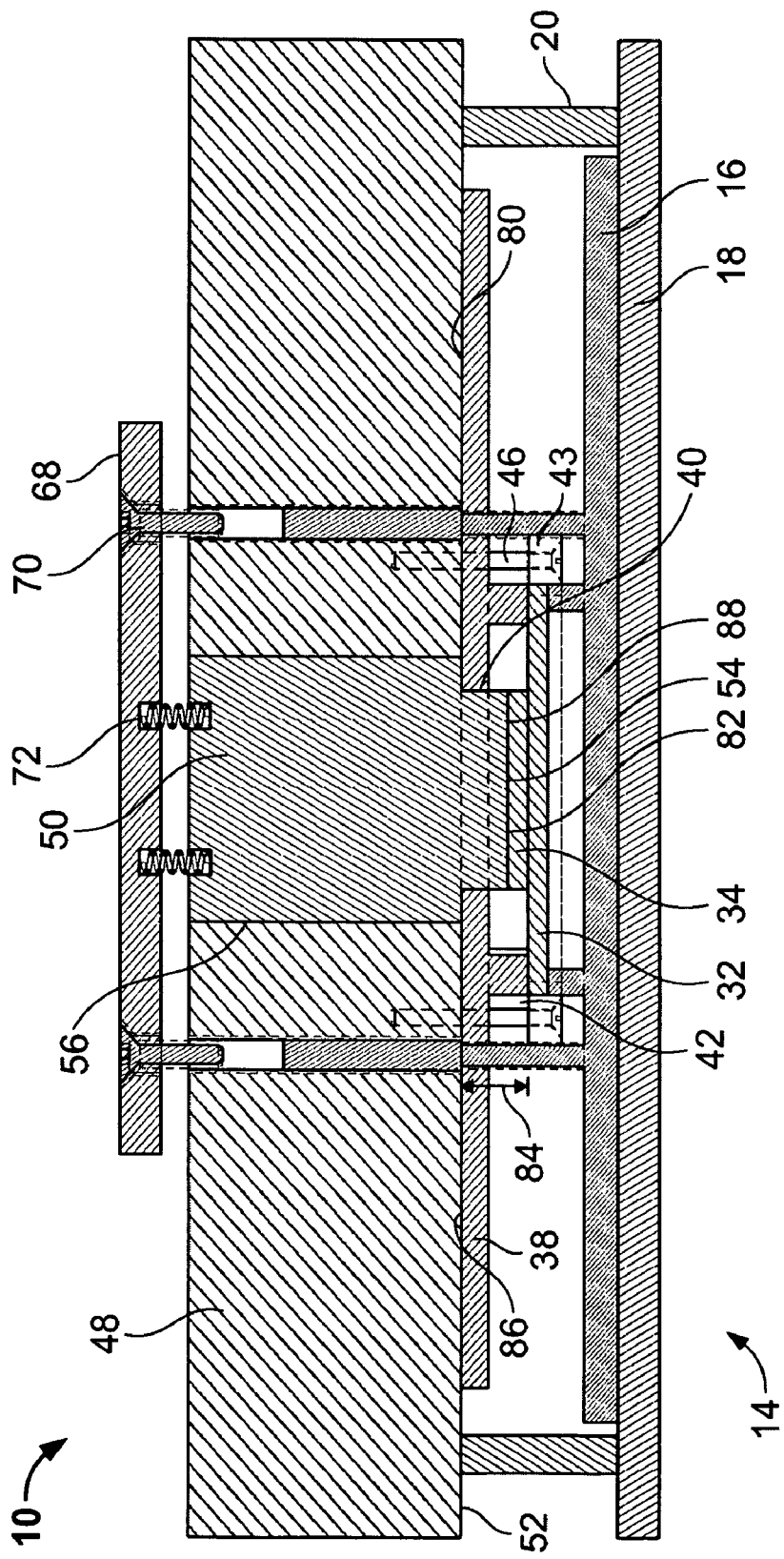
FIG. 3 illustrates a cross-sectional view of the electronic assembly shown in FIG. 1 in an assembled state in accordance with an exemplary embodiment of the present invention.

FIG. 3 illustrates a cross-sectional view of the electronic assembly 10 in an assembled state. The IC components 14, such as, for example, the CPU 32 and the VR module 38 are arranged in a vertically stacked configuration such that an interface surface 80 of the VR module 38 and an interface surface 82 of the CPU 32, or the integrated heat sink 34 when present, are parallel to one another and are separated from one another by a distance 84. When assembled, the lower surfaces 52 and 54 of the outer and inner heat sinks 48 and 50, respectively, engage and are in thermal communication with the interface surfaces 80 and 82, respectively. As such, the lower surfaces 52 and 54 are also vertically separated from one another.

A thermal interface material 86 may be positioned between the lower surface 52 of the outer heat sink 48 and the interface surface 80 of the VR module 38. More specifically, a thermal interface material 88 may be positioned between the lower surface 54 of the inner heat sink 50 and the interface surface 82 of the CPU 32. As those in the art would appreciate, the thermal interface material 86 or 88 enhances the heat conductivity between the heat sinks 48 and 50 and the respective IC components 14.

An exemplary method of assembly is described below. However, it is to be understood that the following description is for illustrative purposes only and is but one potential method of assembly of the electronic assembly 10.

Prior to assembly, the outer heat sink 48 is oriented with respect to the VR module 38. The thermal interface material 86 may be mounted onto the lower surface 54 of the outer heat sink 50. The VR module 38 is positioned such that the interface surface 80 of the VR module 38 engages the thermal interface material 86 and/or the lower surface 54. The VR module 38 may be rigidly attached to the outer heat sink 50 with fasteners (not shown). The connectors 42 may be pre-mounted to the VR module 38 prior to mounting the VR module 38 onto the outer heat sink 48. The CPU 32 is positioned onto the connectors 42 such that the integrated heat sink 34 is substantially aligned with the opening 40 in the VR module 38. The fasteners 46 are then placed through the fastening bores 44. As the fasteners 46 are tightened, the CPU 32 and the connectors 42 are seated and/or tightened to one another. In one embodiment, the CPU 32 may include a clamp plate (not shown) for applying an even normal force along the CPU 32 during tightening. Additionally, the tightening of the fasteners 46 engages the VR module 38 with the outer heat sink 48.

The above assembly is then positioned on the socket 16. The fasteners 20 are then placed through the circuit board 18 and the fastening bores 62 of the outer heat sink 48. The fasteners are tightened to achieve full compression of the socket contacts (not shown) with the CPU 32.

The inner heat sink 50 is then positioned within the opening 56 of the outer heat sink 48. The thermal interface material 88 may be loaded onto the lower surface 54 of the inner heat sink 50 prior to positioning the inner heat sink 50 within the outer heat sink 48. Once loaded, the inner heat sink 50 is surrounded by the outer heat sink 48. In one embodiment, the load plate 68 and biasing members 72 are pre-attached to the inner heat sink 50. When the inner heat sink 50 is inserted into the opening 56, the load plate 68 is aligned with the fastening bores 62 of the outer heat sink 48. Alternatively, the load plate 68 may be attached to the inner heat sink 50 after the inner heat sink 50 is loaded into the outer heat sink 48. Once the load plate 68 is positioned with respect to the outer and inner heat sinks 48 and 50, the fasteners 70 are tightened until the desired normal forces between the components are achieved, and the inner heat sink 50 engages the integrated heat sink 34 of the CPU 32.

Figure 4:
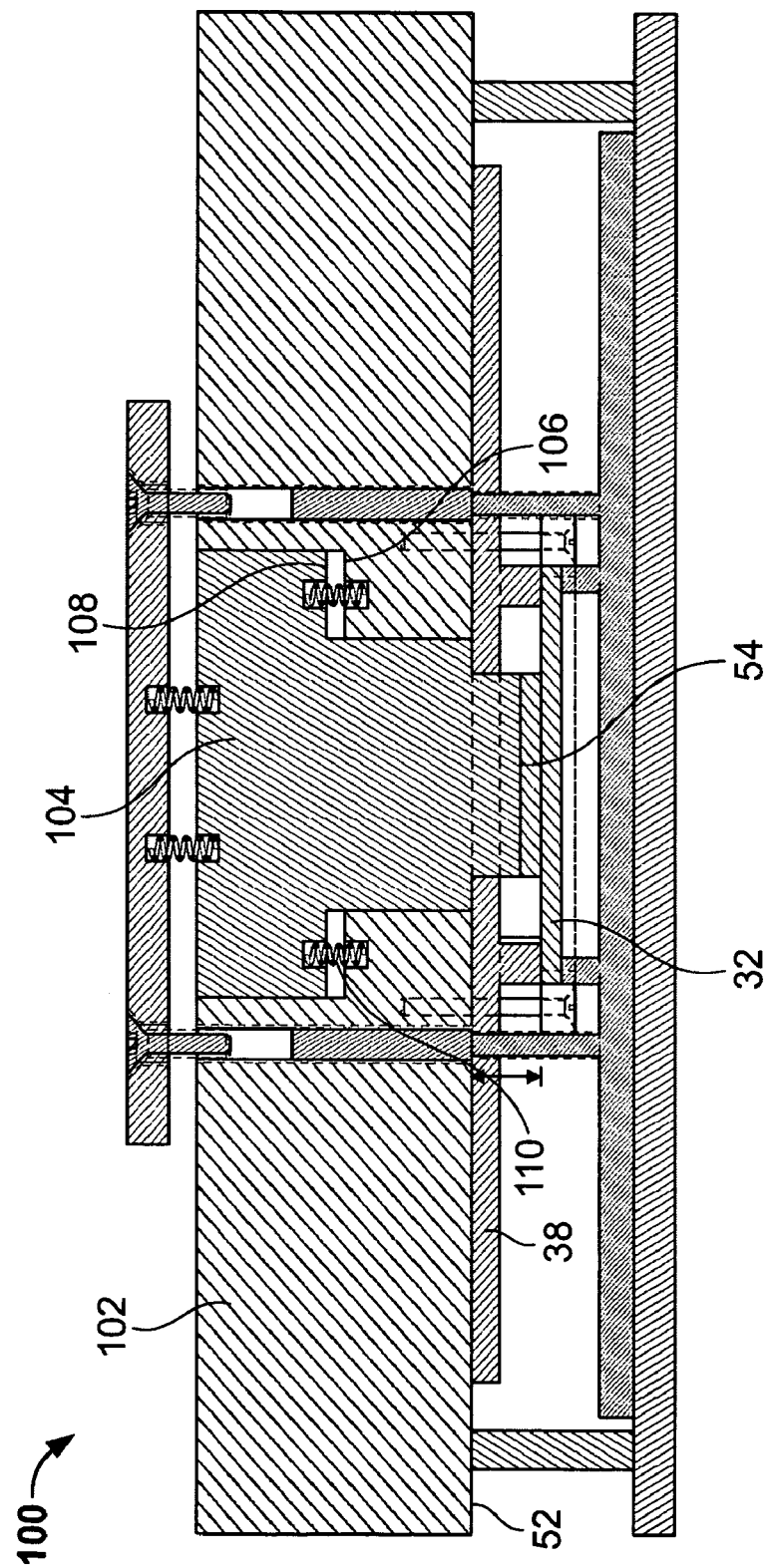
FIG. 4 illustrates a cross-sectional view of an alternative electronic assembly formed in accordance with an alternative embodiment of the present invention.

FIG. 4 illustrates a cross-sectional view of an alternative electronic assembly 100 in an assembled state. The electronic assembly 100 includes similar components to the embodiments described above. Like reference numerals are numbered the same as those described and shown with respect to FIGS. 1-3. The electronic assembly 100 includes an outer heat sink 102 and an inner heat sink 104. The outer and inner heat sinks 102 and 104, respectively, engage and are in thermal communication with the VR module 38 and the CPU 32, respectively. Additionally, the outer and inner heat sinks 102 and 104, respectively, engage and are in thermal communication with one another.

The outer heat sink 102 includes a ledge or shoulder 106 extending substantially parallel to and spaced apart from the lower surface 52 of the outer heat sink 102. Additionally, the inner heat sink 104 includes a ledge or shoulder 108 extending substantially parallel to and spaced apart from the lower surface 54 of the inner heat sink 104. In one embodiment, each of the ledges 106 and 108 of the outer and inner heat sinks 102 and 104, respectively, are in abutting contact with one another. In the exemplary embodiment, a plurality of biasing members 110, such as, for example, springs, are positioned between the ledges 106 and 108 to provide a biasing force from the inner heat sink 104 to the outer heat sink 102. The biasing members 110 provide a biasing force on the outer heat sink 102 to keep the outer heat sink 102 in thermal communication with the VR module 38.

The embodiments thus described provide an electronic assembly 10 including a heat sink assembly 12 for cooling multiple stacked IC components 14. The heat sink assembly 12 includes an inner heat sink 50 that is encapsulated by an outer heat sink 48. The heat sinks 48 and 50 are moveable with respect to one another and are oriented such that the lower surfaces 52 and 54 of the heat sinks 48 and 50 are vertically displaced from one another. As such, the heat sinks 48 and 50 may be in thermal communication with IC components 14 provided on multiple levels above a common side of a circuit board 18. Specifically, the IC components may be vertically stacked with respect to one another wherein the IC components 14 at the higher level include access openings 40 that allow a heat sink 50 to extend through to engage the IC components 14 at a lower level. Accordingly, the overall size of the electronic assembly 10 may be reduced and the footprint defined by the electronic assembly 10 may also be reduced. Because the assembly 10 extends above only one side of the board 18, and further because the inner heat sink 50 is received within the outer heat sink 48, the assembly 10 has a lower vertical profile, measured perpendicularly from the surface of the board 18, than known heat sink assemblies, thereby avoiding clearance issues when multiple circuit boards and components are utilized.

While the invention has been described in terms of various specific embodiments, those skilled in the art will recognize that the invention can be practiced with modification within the spirit and scope of the claims.

What is claimed is:

1. A heat sink assembly comprising:
   a circuit board, a first integrated circuit package and a second integrated circuit package mounted to the circuit board in a stacked relation to one another;
   a first heat sink engaged to and in thermal communication with the first integrated circuit package; and
   a second heat sink engaged to and in thermal communication with the second integrated circuit package, wherein each of said first and second heat sinks are positioned over the first and second integrated circuit packages on a single side of the circuit board.

2. The heat sink assembly of claim 1, wherein at least one of the first and second integrated circuit packages comprises an integrated heat sink engaging a corresponding one of said first and second heat sinks.

3. The heat sink assembly of claim 1, further comprising at least one power connector positioned between the first and second integrated circuit packages such that the first integrated circuit package, the at least one power connector, and the second integrated circuit package are vertically stacked over the same side of the circuit board.

4. The heat sink assembly of claim 1, wherein a thermal interface material is oriented between each said heat sink body and a corresponding one of the integrated circuit packages.

5. The heat sink assembly of claim 1, wherein said second heat sink extends through the first integrated circuit package and is engaging the second integrated circuit package.

6. The heat sink assembly of claim 1, wherein the first integrated circuit package includes an opening extending therethrough and exposing the second integrated circuit package, said second heat sink extending through the opening and engaging the second integrated circuit package.

7. The heat sink assembly of claim 1, wherein said second heat sink is biased such that said second heat sink is moveable with respect to said first heat sink body.

8. The heat sink assembly of claim 1, wherein said first heat sink includes an opening extending therethrough and exposing the second integrated circuit package, said second heat sink extending through the opening and engaging the second integrated circuit package.

9. The heat sink assembly of claim 1, wherein said second heat sink is enclosed by said first heat sink.

10. The heat sink assembly of claim 1, wherein the first heat sink includes a first thermal interface engaged to the first integrated circuit package and the second heat sink includes a second thermal interface engaged to the second integrated circuit package, wherein the first and second thermal interfaces both face the circuit board.

11. The heat sink assembly of claim 1, wherein the second heat sink includes a second thermal interface engaged to the second integrated circuit package and side walls extending perpendicularly from the second thermal interface, wherein the side walls are surrounded by the first heat sink.

12. A heat sink assembly comprising:
a first heat sink comprising a thermal interface configured to be in thermal communication with a first integrated circuit package; and
a second heat sink surrounded by said first heat sink and comprising a thermal interface configured to be in thermal communication with a second integrated circuit package, wherein the first and second integrated circuit packages are vertically stacked with respect to one another.

13. The heat sink assembly of claim 12, wherein the first and second integrated circuit packages are vertically separated from one another by at least one power connector.

14. The heat sink assembly of claim 12, wherein said first heat sink comprises an opening extending therethrough and exposing the second integrated circuit package, said second heat sink at least partially received within the opening and engaging the second integrated circuit package.

15. The heat sink assembly of claim 12, wherein said second heat sink extends through the first integrated circuit package and is engaging the second integrated circuit package.

16. The heat sink assembly of claim 12, wherein said second heat sink body is spring biased such that said second heat sink body is moveable with respect to said first heat sink body.

17. The heat sink assembly of claim 12, wherein the first integrated circuit package includes an opening extending therethrough and exposing the second integrated circuit package, said second heat sink extending through the opening and engaging the second integrated circuit package.

18. The heat sink assembly of claim 12, further comprising a load plate coupled to said first heat sink body, said load plate comprising at least one biasing member coupled to said second heat sink body, such that said second heat sink body is at least partially biased through said first heat sink body.

19. The heat sink assembly of claim 12, further comprising a third heat sink surrounded by said second heat sink and comprising a thermal interface configured to be in thermal communication with a third integrated circuit package, wherein the first, second, and third integrated circuit packages are vertically stacked with respect to one another.

20. A heat sink assembly comprising:
a circuit board;
a central processing unit mounted to the circuit board;
a voltage regulator module mounted to the central processing unit, wherein the central processing unit and the voltage regulator are mounted in a stacked relation to one another on a common side of the circuit board;
a first heat sink engaged to and in thermal communication with the central processing unit; and
a second heat sink surrounded by said first heat sink, said second heat sink engaged to and in thermal communication with the voltage regulator module.

* * * * *